May 2, 1961 | P. EMILE, JR | 2,982,868
TRANSISTORIZED GATING CIRCUIT
Filed May 23, 1958
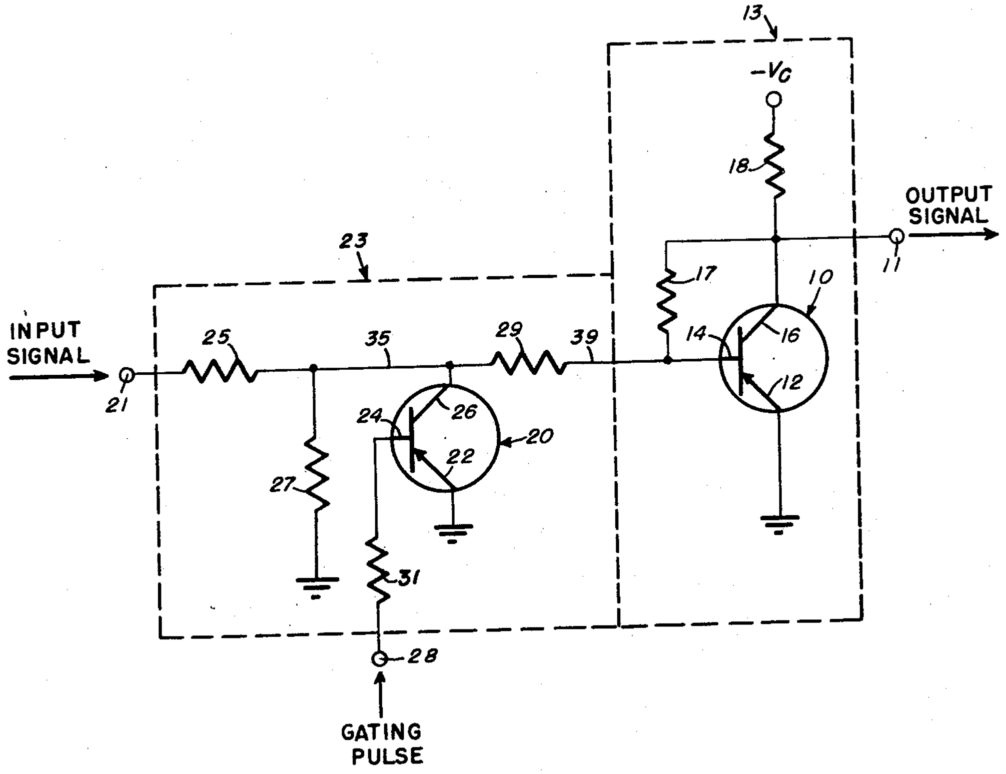
Inventor,
PHILIP EMILE, JR.
BY W. E. Thibodeau, A. J. Dupont, N. Cass & J. D. Edgerton United States Patent Office 2,982,868

Patented May 2, 1961

2,982,868

TRANSISTORIZED GATING CIRCUIT

Philip Emile, Jr., Washington, D.C., assignor to the United States of America as represented by the Secretary of the Army Filed May 23, 1958, Ser. No. 737,460

3 Claims. (Cl. 307—88.5)

(Granted under Title 35, U.S. Code (1952), sec. 266)

The invention described herein may be manufactured and used by or for the Government for governmental purposes without the payment to me of any royalty thereon.

This invention relates to an improved transistorized gating circuit.

An object of this invention is to provide a simple transistorized gating circuit which passes an input signal without distortion when a relatively low level gating pulse is applied.

An aditional object is to employ D.-C. coupling in the above circuit without having the gating pulse produce a significant shift of the D.-C. level at the circuit output.

A typical embodiment of the invention basically comprises a first transistor connected as a one-stage common emitter amplifier in combination with an input circuit having a T network of resistors with a second transistor having its collector and emitter connected in parallel with the middle resistor of the T network. Upon application of a saturating gating pulse to the base of the second transistor, the second transistor acts as a shorting switch to prevent any input signal from reaching the amplifier transistor. The circuit takes advantage of the unusual property that a saturated transistor acts as a very low impedance for both positive and negative voltages applied between its collector and emitter terminals.

The specific nature of the invention, as well as other objects, uses, and advantages thereof, will clearly appear from the following description and from the accompanying drawing, in which:

The drawing is a circuit diagram of a transistorized gating circuit in accordance with the invention.

The circuit of this invention may be broken down into two portions as shown in the drawing: an amplifier 13 and an input circuit 23.

The amplifier 13 may preferably comprise a first PNP transistor 10 having a grounded emitter 12, a base 14, and a collector 16 connected as a one-stage common emitter amplifier. A D.-C. voltage source $-V_c$ is applied to the collector 16 through a collector resistor 18 in a conventional manner. A resistor 17 connected between the collector 16 and the base 14 biases the transistor 10 for class A operation with the voltage at the base very close to zero. Such biasing is also conventional. The transistor 10 thus operates as a common emitter amplifier. The output signal may be obtained at the terminal 11 connected to the collector 16. In a particular embodiment of the amplifier 13 employing a 2N77 transistor for transistor 10, the following component values were chosen: collector resistor 18, 2000 ohms; bias resistor 17, 120,000 ohms; and collector voltage source $-V_c$, 10 volts.

The input circuit 23 comprises a T network of resistors 25, 27 and 29 with a second PNP transistor 20 having its collector 26 and emitter 22 connected in parallel with the middle resistor 27 of the T network. For the purposes of the claims the grounded resistor 27 will be referred to as the middle resistor of the T network and the ends of the T network will be considered to be at the ends of resistors 25 and 29 opposite the junction of the three resistors 25, 27 and 29. This notation is frequently used in the art in connection with T networks. The base 24 of transistor 22 is connected through a resistor 31 to a gating input terminal 28 to which the gating pulse is applied. The gating pulse and the resistor 31 are chosen so that the current fed to the base 24 saturates the transistor 20. Saturation may be defined as occurring when the base current is greater than the collector current divided by B, where B is the transistor amplication factor at the operating current in the common emitter connection. The base current applied by the gating pulse must of course be sufficient to maintain the transistor 20 saturated for the maximum expected input signal.

When a transistor is saturated, it has the unusual property of acting as a very low impedance for both positive and negative voltages appearing between its collector and emitter. At saturation this very low impedance for most transistors is less than 10 ohms. A symmetrical transistor is one which when saturated has the same very low impedance between emitter and collector for both positive and negative signals.

In the drawing, if the transistor 20 is of the PNP type, a negative gating pulse chosen as described above, will produce saturation. When such a negative saturating gating pulse is applied to the terminal 28, the transistor 20 effectively acts as a short-circuit between lead 35 and ground for both negative and positive signals. In the absence of the gating pulse, the transistor 20 is adjusted to have a high impedance so as to permit the input signal at lead 35 to be applied to the amplifier 13. For most transistors, the absence of a bias at terminal 28 provides a sufficient high impedance, but if a very high impedance is desired the base 24 may be biased to cutoff by well known means. For the circuit shown in the drawing a sufficient high impedance is obtained with no additional bias applied to the base 24.

The T network resistors 25, 27 and 29 are chosen to provide a compromise between maximum gain, maximum gating effect and minimum D.-C. level shift. The choice of these resistors 25, 27 and 29 depends upon which of the above features is most important in a particular application. For minimum D.-C. level shift at the output terminal 11, the resistors 29 and 27 are chosen to minimize the impedance change looking backward from the base 14 of transistor 10 when the transistor 20 is gated. This will reduce the effective change in the current in collector lead 16 so that only a small D.-C. level shift occurs at the output terminal when the transistor 20 is gated. As is well known, a D.-C. gating lever shift called a "gating pedestal" is undesirable in many applications. The use of a capacitor to maintain D.-C. level shift is also undersirable since it may cause distortion.

As will be understood by those in the art when the transistor 20 is gated, the impedance looking backward from the base 14 of the transistor 10 will be essentially the value of the resistor 29 since the transistor 20 acts as an effective short circuit between lead 35 and circuit ground. In the absence of a gating pulse, the impedance looking back will be the value of resistor 29 in series with the parallel combination of the ungated transistor impedance, the resistor 27, and the resistor 25 in series with the impedance of the input signal source (not shown). Since the resistor 29 is in series with the input of the amplifier 13 it must be small enough to permit sufficient signal to be applied to the base 14 of the transistor amplifier 13 to achieve the desired circuit gain.

The resistor 25 determines the amount of signal appearing at lead 35 when the transistor 20 is gated and also serves to prevent the input signal source (not shown)

from being shorted when the transistor 20 is gated. The resistor 25 acting as a voltage divider also determines the amount of input signal appearing at lead 35 in the absence of a gating pulse. The impedance between collector 26 and emitter 22 will ordinarily be quite high in the absence of a gating pulse. The impedance between the base 14 and ground is relatively small. Thus, the parallel combination of resistors 27 and 29 serve as the other half of the voltage divider. The resistor 25 therefore is chosen in conjunction with the resistors 27 and 29 to provide the desired signal at lead 35 when the transistor 20 is ungated.

From the above discussion those skilled in the art will readily be able to choose the values of the T network resistors 25, 27 and 29 to provide the desired gain, gating effect, and D.-C. level shift for any particular application. In a particular embodiment of the input circuit 23 employing a 2N77 transistor as the transistor 20, the values of the T network resistors were chosen as follows: resistors 25 and 29 each 5,000 ohms; resistor 27, 10,000 ohms, and a saturating gating pulse of −3 volts.

The operation of the gating circuit of the drawing may be described as follows. In the absence of a gating pulse at terminal 28, the impedance between the collector 26 and the emitter 22 is high so that the input signal applied to terminal 21 passes to the amplifier 13 appears at the output terminal 11 without distortion. Upon application of a saturating negative gating pulse to the terminal 28, the transistor 20 acts as an effective short circuit between its collector 26 and emitter 24 for both positive and negative voltages. The input signal thus divides between the relatively large resistor 25 and the effective short circuit so that practically no signal passes to the amplifier 13 and thus no input signal appears at the output terminal 11. The values of resistors 29 and 27 are chosen to minimize any D.-C. level shift at the output 11 caused by the gating pulse.

The above described operation is commonly referred to as transmission gating. It is to be understood that the circuit shown in the drawing could also be operated with the transistor 20 initially saturated and no input signal appearing at the output terminal 11. A positive gating pulse may then be applied to cause the input signal to appear at the output terminal 11. Such operation is commonly referred to as sample gating.

In a circuit constructed using the specific component values previously stated for the input circuit 23 and the amplifier 13, an input signal of 10 volts peak-to-peak is applied to input terminal 21. At lead 35 the voltage is down to 2.5 volts peak-to-peak due to the drop in the resistor 25. At the base 14 of the amplifier transistor 10, the amplitude is down to about 90 millivolts due to the voltage divider action of the resistor 28, the resistance between the base 14 and ground being about 2,000 ohms. This 90 millivolt signal is amplified by transistor amplifier 13 to an output voltage of about 7.5 volts peak-to-peak at the output terminal 11. The overall gain of the circuit is thus about 0.75.

The input impedance at input terminal 21 is 5,000 ohms when the transistor 20 is gated and 9,000 ohms when ungated. The impedance looking backward from the base 16 of transistor 20 is gated and 15,000 ohms when ungated. This latter impedance change causes a change in collector current of transistor 10 about 10% producing a D.-C. level shift at output terminal 11 of only about 0.5 volt.

The gating circuit of this invention may have a wide variety of uses. For example, this circuit may be used for phase comparison between the input signal and the gating pulse, or for pulse or amplitude modulation of the input signal by the gating pulse. For this latter use, the transistor 20 should preferably be of the symmetrical type. Many other uses will readily be apparent to those skilled in the art.

It will be apparent that the embodiment shown are only exemplary and that various modifications can be made in construction and arrangement within the scope of the invention as defined in the appended claims.

I claim as my invention:

1. A transistorized gating circuit comprising in combination: a one-stage common emitter transistor amplifier, a negative D.C. voltage source connected to the collector of said transistor, and an input circuit feeding said amplifier, said input circuit having a three resistor T network and a switching transistor, said switching transistor having an emitter, a base and a collector, said collector and emitter being connected in parallel with the middle resistor of said T network, one end of said T network being connected to the input of said amplifier and the input signal being applied to the other end of said T network, and means for applying a gating pulse to the base of said switching transistor, the resistors of said T network being chosen to give the desired gain, gating effect, and D.-C. level shift of the output signal from said amplifier.

2. A transistorized gating circuit comprising in combination: a one-stage transistor amplifier including a first transistor having a grounded emitter, a base and a collector in a common emitter connection, a negative D.C. voltage source connected to said collector and an input circuit feeding said amplifier, said input circuit comprising a three resistor T network and a second transistor, said second transistor having a grounded emitter, a base and a collector, one end of said T network serving as an input terminal for an input signal, and the other end of said T network being connected to the base of said first transistor, the end of the middle resistor of said T network which is removed from the junction of said three resistors being connected to ground, the collector of said second transistor being connected to the junction of the three resistors of said T network, and means for applying a gating pulse to the base of said second transistor, said gating pulse causing saturation of said second transistor thereby causing the impedance between the collector and emitter of said second transistor to fall to a very low value for both positive and negative voltages applied therebetween, the three resistors of said T network being chosen so that negligible input signal passes to the base of said first transistor when said gating pulse is applied to the base of said second transistor, said three resistors further being chosen to provide a minimum gating D.-C. level shift at the output of said amplifier.

3. A transistorized gating circuit comprising in combination: a first PNP transistor having a grounded emitter, a base and a collector in a common emitter connection, a collector resistor, a negative D.-C. voltage source applied to said collector through said collector resistor, a biasing resistor connected between said collector and said base, an output terminal connected to said collector, said first transistor being adjusted for class A amplifier operation, a second PNP transistor having a grounded emitter, a base and a collector, a three resistor T network, an input terminal to which an input signal is applied, one end of said T network being connected to said input terminal and the other end of said T network being connected to the base of said first transistor, the end of the middle resistor of said T network removed from the junction of said three resistors being connected to ground the collector of said second transistor being connected to the junction of the three resistors of said T network, and means for applying a gating pulse to saturate said second transistor for the maximum expected positive input voltage, said means being connected to the base of said second transistor, the application of said gating pulse thereby causing the impedance between the collector and emitter of said second transistor to fall to a very low value for both positive and negative voltages applied therebetween, the three resistors of said T network being chosen so that negligible input signal passes to the base of said first transistor when said gating pulse is applied to the base of said second transistor, said three resistors further being chosen to provided a minimum gating D.-C. level shift at said output terminal.

References Cited in the file of this patent

UNITED STATES PATENTS

| | | |
|---|---|---|
| 2,601,096 | Creamer et al. | June 17, 1952 |
| 2,663,800 | Herzog | Dec. 22, 1953 |
| 2,872,595 | Pinckaers | Feb. 3, 1959 |